(12) United States Patent
Ahn

(10) Patent No.: US 9,466,389 B2
(45) Date of Patent: Oct. 11, 2016

(54) MULTIPLE PROGRAMMING PULSE PER LOOP PROGRAMMING AND VERIFICATION METHOD FOR NON-VOLATILE MEMORY DEVICES

(71) Applicant: SK hynix Inc., Gyeonggi-do (KR)

(72) Inventor: Jung Ryul Ahn, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/570,721

(22) Filed: Dec. 15, 2014

(65) Prior Publication Data

US 2016/0005472 A1    Jan. 7, 2016

(30) Foreign Application Priority Data

Jul. 7, 2014   (KR) ........................ 10-2014-0084513

(51) Int. Cl.

| | | |
|---|---|---|
| *G11C 16/34* | (2006.01) | |
| *G11C 16/10* | (2006.01) | |
| *G11C 11/56* | (2006.01) | |
| *G11C 16/12* | (2006.01) | |
| *G11C 11/34* | (2006.01) | |

(52) U.S. Cl.
CPC ........... *G11C 16/34* (2013.01); *G11C 11/5628* (2013.01); *G11C 16/10* (2013.01); *G11C 16/12* (2013.01); *G11C 16/3481* (2013.01); *G11C 11/34* (2013.01)

(58) Field of Classification Search
CPC .... G11C 16/34; G11C 16/10; G11C 16/3459
See application file for complete search history.

(56) References Cited

U.S. PATENT DOCUMENTS

| | | | | |
|---|---|---|---|---|
| 7,139,192 B1 * | 11/2006 | Wong | .................. | G11C 11/5628 365/185.03 |
| 2007/0297247 A1 | 12/2007 | Hemink | | |
| 2011/0051510 A1 * | 3/2011 | Honma | .................. | G11C 16/10 365/185.03 |
| 2014/0119096 A1 * | 5/2014 | Kwon | ................ | G11C 13/0069 365/148 |
| 2015/0078093 A1 * | 3/2015 | Hahn | ..................... | G11C 16/10 365/185.19 |

FOREIGN PATENT DOCUMENTS

| | | |
|---|---|---|
| KR | 1020090092099 | 8/2009 |
| KR | 1020130012308 | 2/2013 |
| KR | 1020130016619 | 2/2013 |
| KR | 1020130069626 | 6/2013 |
| KR | 1020130101976 | 9/2013 |

* cited by examiner

*Primary Examiner* — J. H. Hur
*Assistant Examiner* — Ajay Ojha
(74) *Attorney, Agent, or Firm* — IP & T Group LLP

(57) ABSTRACT

A semiconductor device includes a memory block including memory cells connected to a word line, and an operation circuit suitable for consecutively applying a main program pulse and a sub program pulse to the word line to perform a program operation of the memory cells, and suitable for performing a program verification operation of the memory cells, wherein the sub program pulse has a lower voltage level than the main program pulse.

16 Claims, 7 Drawing Sheets

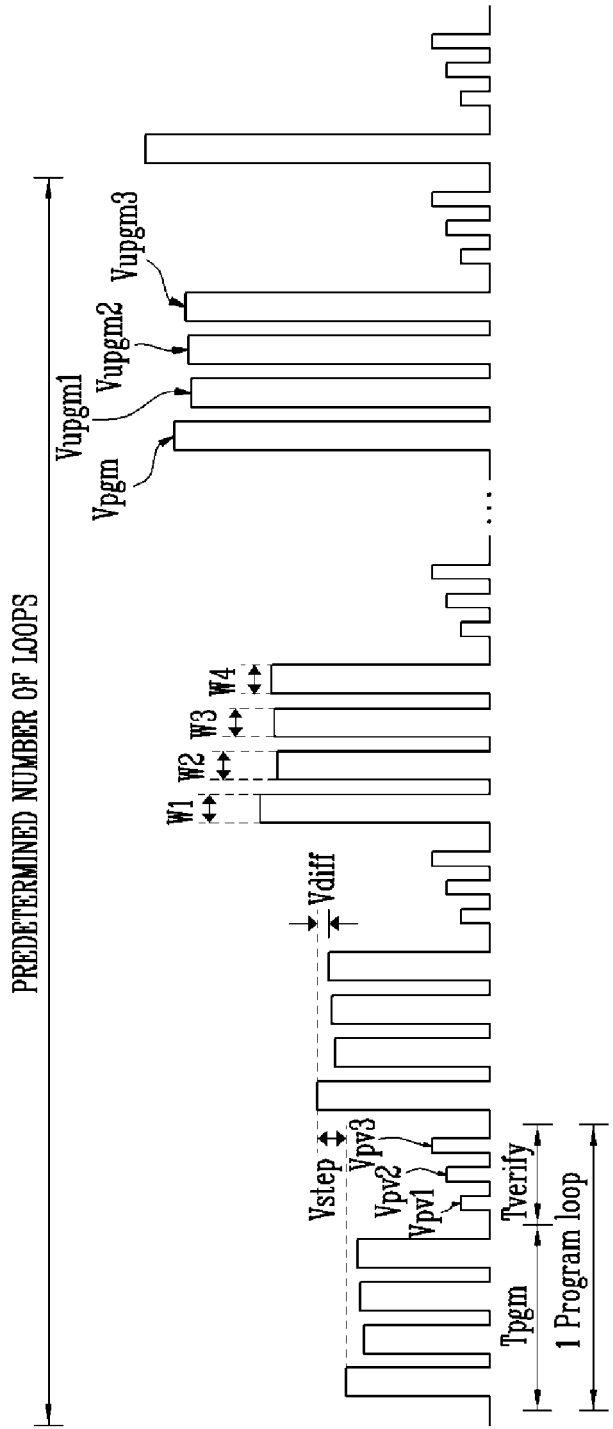

MULTIPLE PROGRAMMING PULSE PER LOOP PROGRAMMING AND VERIFICATION METHOD FOR NON-VOLATILE MEMORY DEVICES

CROSS-REFERENCE TO RELATED APPLICATION

The present application claims priority to Korean patent application number 10-2014-0084513, filed on Jul. 7, 2014, the entire disclosure of which is herein incorporated by reference.

BACKGROUND

1. Field of the Invention

The present invention relates to a semiconductor device and, more particularly, to a semiconductor device including memory cells.

2. Discussion of Related Art

A flash memory device is a typical semiconductor device that has nonvolatile memory cells. Data is stored in memory cells by an increment step pulse program (ISPP) method, which includes a program operation and a verification operation. Specifically, a threshold voltage of the memory cell is changed by the program operation depending on the data programmed and stored therein.

A loss of data (i.e. charge) may occur in a programmed memory cell. Even when the threshold voltage of a programmed memory cell reaches the target voltage during the verification operation, the threshold voltage may drop below the target voltage due to charge leakage. A memory cell that has lost its charge may also be referred to as an under programmed cell.

If the threshold voltage of the memory cell changes due to unintended charge leakage, data stored in the memory cell may change, resulting in an error.

SUMMARY

The present invention is directed to a semiconductor device with improved electrical characteristics and reliability.

One aspect of the present invention provides a semiconductor device including a memory block including memory cells connected to a word line, and an operation circuit suitable for consecutively applying a main program pulse and a sub program pulse to the word line to perform a program operation of the memory cells, and suitable for performing a program verification operation of the memory cells, wherein the sub program pulse has a lower voltage level than the main program pulse.

Another aspect of the present invention provides a semiconductor device including a memory block including a plurality of word lines each connected to a plurality of memory cells, and an operation circuit suitable for performing a program loop including a program operation for programming memory cells of a selected word line, among the plurality of word lines, and a program verification operation for verifying the program operation of the memory cells, wherein the operation circuit performs the program operation by consecutively applying a first program pulse and a second program pulse, having a lower voltage level than the first program pulse, to the selected word line.

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIGS. 3A to 3C are waveform diagrams illustrating an operation method of the semiconductor device according to an exemplary embodiment of the present invention;

DETAILED DESCRIPTION

Figure 1:
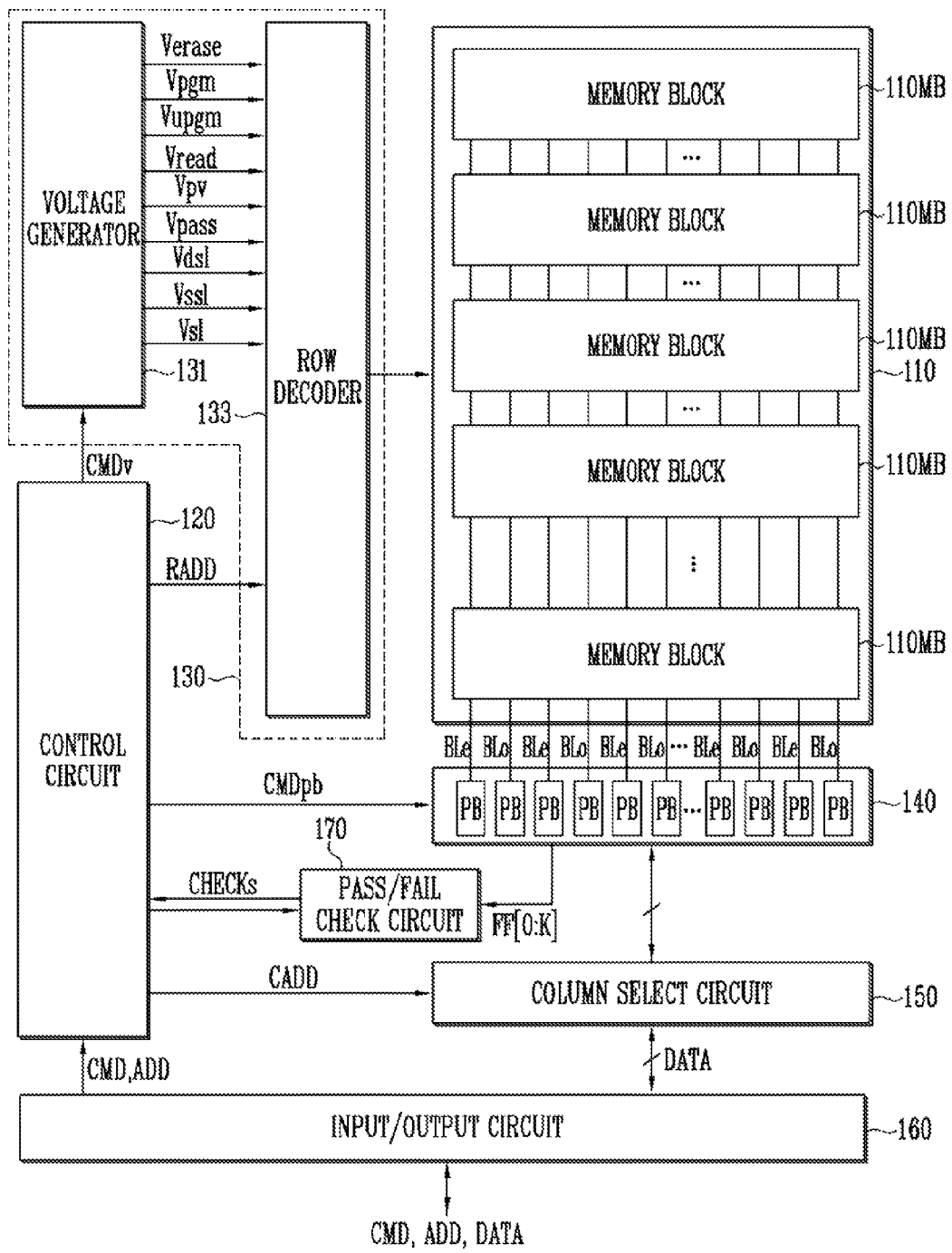
FIG. 1 is a block diagram illustrating a semiconductor device according to an exemplary embodiment of the present invention.

Advantages and features of the present invention and methods of achieving the same will be described more fully hereinafter with reference to the accompanying drawings, in which exemplary embodiments of the invention are shown. This invention may, however, be embodied in different forms and should not be construed as limited to the embodiments set forth herein. The embodiments of the present invention are described in detail to enable the inventive concept for those of ordinary skill in the art, and the spirit and scope of the present invention should be understood by the claims below.

Throughout the disclosure, like reference numerals correspond directly to the like numbered parts in the various figures and embodiments. In this specification, a singular form may include a plural form as long as it is not specifically mentioned in a sentence. Furthermore, 'include/comprise' or 'including/comprising' used in the specification represents that one or more components, steps, operations, and elements exist or are added.

FIG. 1 is a block diagram illustrating a semiconductor device according to an exemplary embodiment of the present invention.

Referring to FIG. 1, a semiconductor device includes a memory array 110 and operation circuits 120 to 170. The memory array 110 includes a plurality of memory blocks 110 MB. A structure of the memory block 110 MB will be described as follows.

Figure 2:
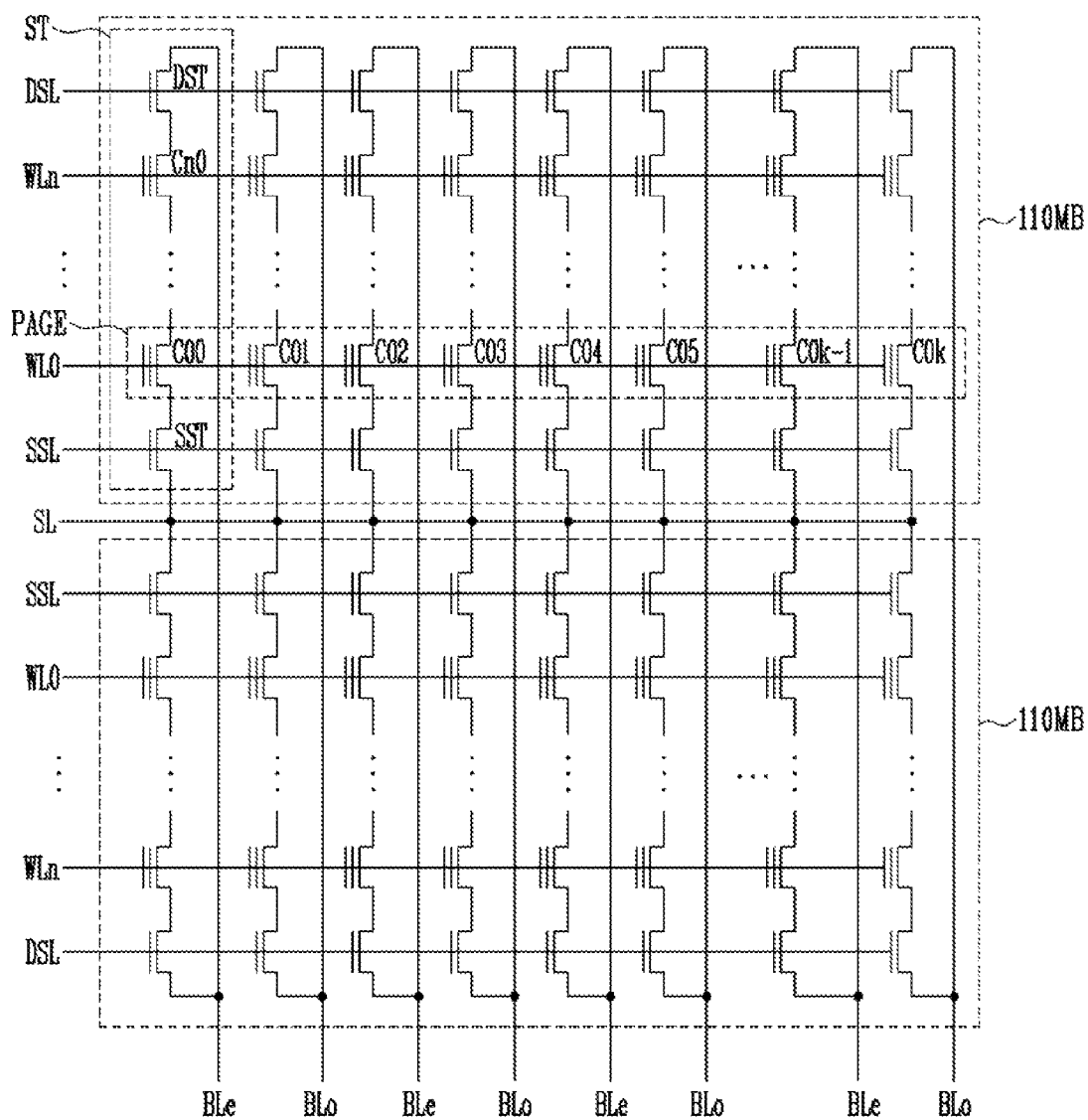
FIG. 2 is a circuit diagram illustrating a memory block shown in FIG. 1.

FIG. 2 is a circuit diagram illustrating a memory block 110B shown in FIG. 1.

Referring to FIG. 2, each memory block 110B includes a plurality of memory strings ST connected between bit lines BLe and BLo and a common source line SL. That is, the memory strings ST are connected to the respective bit lines BLe and BLo, and commonly connected to the common source line SL. Each memory string ST includes a source select transistor SST, which connects a source to the common source line SL, a cell string in which a plurality of memory cells C00 to Cn0 are connected in series, and a drain select transistor DST which connects a drain to a corresponding bit line of the bit lines BLe and BLo. The memory cells C00 to Cn0 included in the cell string are connected in series between the select transistors SST and DST. A gate of the source select transistor SST is connected to a source select line SSL, and a gate of the drain select transistor DST is connected to a drain select line DSL. Gates of the memory cells C00 to Cn0 are connected to word lines WL0 to WLn, respectively.

The drain select transistor DST controls to connect or disconnect the cell string with or from the bit line, and the source select transistor SST controls to connect or disconnect the cell string with or from the common source line SL.

In a NAND flash memory device, the memory cells included in a memory cell block 110B are classified into physical page units or logical page units. For example, the memory cells C00 to C0k connected to one word line (e.g., WL0) are formed as one physical page PAGE. In addition, even-numbered memory cells C00, and C02 to C0k−1 connected to one word line (e.g., WL0) are formed as an even page, and odd-numbered memory cells C0, and C03 to C0k connected to one word line (e.g., WL0) are formed as an odd page. The above-described pages (i.e., the even page and the odd page) may be basic units in a program operation or read operation.

Again, referring to FIGS. 1 and 2, the operation circuits 120 to 170 are configured to perform a program loop, an erase loop, and a read operation of the memory cells C00 to C0k connected to a selected word line (e.g., WL0). The program loop includes a program operation and a program verification operation, and the erase loop includes an erase operation and an erase verification operation.

The operation circuits 120 to 170 may perform the program loop using an increment step pulse program (ISPP) method. That is, the operation circuits 120 to 170 may repeatedly perform the program operation and the program verification operation until all threshold voltages of the memory cells C00 to C0k connected to the selected word line (e.g., WL0) increase up to a target level. In other words, the operation circuits 120 to 170 may repeatedly perform the program operation, which stores data in the memory cells C00 to C0k, and the program verification operation, which verifies data stored therein, until external input data is determined to be stored in the memory cells C00 to C0k of the selected word line (e.g., WL0).

The operation circuits 120 to 170 may increase a program voltage Vpgm applied to the selected word line by a predetermined voltage step whenever the program operation is performed again. That is, when the program operation is performed, the operation circuits 120 to 170 may apply the program voltage Vpgm, which is increased by the predetermined voltage step from a program voltage used in a previous program operation, to the selected word line WL0.

The operation circuits 120 to 170 may be configured to perform the program verification operation using a plurality of different program verification voltages. For example, when data of 2 bits is stored in each unit cell, the program verification operation may be performed using three verification voltages. In addition, when data of 3 bits is stored in each unit cell, the program verification operation may be performed using seven verification voltages.

To perform the program loop, the erase loop, and the read operation, the operation circuits 120 to 170 may be configured to selectively output operation voltages Verase, Vpgm, Vupgm, Vread, Vpv, Vpass, Vdsl, Vssl, and Vsl to local lines SSL, WL0 to WLn, and DSL of a selected memory block and a common source line SL. Also, the operation circuits 120 to 170 may be configured to control a precharge or discharge of bit lines BLe and BLo or detect a current flow of the bit lines BLe and BLo. For example, the erase voltage Verase is applied to a substrate or bulk (not shown), in which memory cells are formed, during the erase operation, and the program voltage Vpgm is applied to a selected word line during the program operation. The read voltage Vread is applied to the selected word line during the read operation, and the verification voltage Vpv is applied to the selected word line during a verification operation. The pass voltage Vpass is applied to unselected word lines during the program operation, the read operation, or the verification operation, and the drain select voltage Vdsl is applied to a drain select line DSL. The source select voltage Vssl is applied to a source select line SSL, and the source voltage Vsl is applied to a common source line SL.

In a NAND flash memory device, the operation circuits may include a control circuit 120, a voltage supply circuit 130, a read/write circuit group 140, a column select circuit 150, an input/output circuit 160, and a pass/fail check circuit 170. Each component is in described in detail as follows.

The control circuit 120 outputs a voltage control signal CMDv to control the voltage supply circuit 130 in response to a command signal CMD inputted through the input/output circuit 160 from the outside, such that the operation voltages Verase, Vpgm, Vupgm, Vread, Vpv, Vpass, Vdsl, Vssl, and Vsl are generated at desired levels in order to perform the program loop, the erase loop, and the read operation. Further, the control circuit 120 outputs a PB control signal CMDpb to control read/write circuits PB (e.g., page buffers) included in the read/write circuit group 140 in order to perform the program loop, the erase loop, and the read operation. In addition, when an address signal ADD is inputted, the control circuit 120 generates and outputs a column address signal CADD and a row address signal RADD.

The voltage supply circuit 130 generates the operation voltages Verase, Vpgm, Vupgm, Vread, Vpv, Vpass, Vdsl, Vssl, and Vsl required for the program loop, the erase loop, and the read operation of the memory cells in response to the voltage control signal CMDv of the control circuit 120, and outputs the operation voltages to the local lines SSL, WL0 to WLn, and DSL of a selected memory block and the common source line SL in response to the row address signal RADD of the control circuit 120.

The voltage supply circuit 130 may include a voltage generator 131 and a row decoder 133. The voltage generator 131 generates operation voltages Verase, Vpgm, Vupgm, Vread, Vpv, Vpass, Vdsl, Vssl, and Vsl in response to the voltage control signal CMDv of the control circuit 120, and the row decoder 133 transmits the operation voltages to the local lines SSL, WL0 to WLn, and DSL of the selected memory block among the memory blocks 110 MB and the common source line SL in response to the row address signal RADD of the control circuit 120. Verification voltages Vpv1 to Vpv3, which will be described in FIG. 3, may be included in a verification voltage Vpv outputted from the voltage supply circuit 130.

The read/write circuit group 140 may include the plurality of read/write circuits PB (e.g., page buffers) connected to the memory array 110 through the bit lines BLe and BLo. Specifically, the read/write circuits PB each may be connected to one of the bit lines BLe and BLo. That is, one read/write circuit PB may be connected to one bit line. In addition, the read/write circuits PB each may be connected to a pair of bit lines BLe and BLo.

The read/write circuits PB may selectively precharge the bit lines BLe and BLo based on data DATA to be stored in memory cells and the PB control signal CMDpb of the control circuit 120, during the program operation. That is, the read/write circuits PB may selectively apply a program inhibit voltage (e.g., a power supply voltage) and a program permit voltage (e.g., a ground voltage) to the bit lines BLe and BLo during the program operation. A threshold voltage of the memory cell connected to a precharged bit line (i.e., a bit line applied with a program inhibit voltage) is almost unchanged even though the program voltage is applied. In contrast, a threshold voltage of the memory cell connected to a discharged bit line (i.e., a bit line applied with a program permit voltage) may increase by the program voltage.

Based on the PB control signal CMDpb of the control circuit 120, the read/write circuits PB may latch data read from the memory cell by detecting a voltage change or current of the bit lines BLe and BLo after precharging the bit lines BLe and BLo during the verification operation or the read operation.

Meanwhile, the read/write circuits PB may output pass/fail signals FF[0:k] to the pass/fail check circuit 170, based on data read from the memory cells during the verification operation (e.g., the threshold voltages of the memory cells determined from the verification operation). Based on the pass/fail signals FF[0:k], a program pass/fail or an erase pass/fail of each memory cell may be determined. Accordingly, the read/write circuits PB may include a plurality of latch circuits that temporarily store data, which will be stored in the memory cells, and store verification results of the memory cells.

The column select circuit 150 selects the read/write circuits PB included in the read/write circuit group 140 in response to the column address CADD outputted from the control circuit 120. That is, the column select circuit 150 sequentially transmits data, which may be stored in the memory cells, to the read/write circuits PB in response to the column address CADD. In addition, the column select circuit 150 sequentially selects the read/write circuits PB in response to the column address CADD such that the data of the memory cells, which is latched in read/write circuits PB by the read operation, may be outputted to the outside (e.g. an external device).

The input/output circuit 160 transmits the command signal CMD and the address signal ADD, which are inputted from the outside, to the control circuit 120. In addition, the input/output circuit 160 transmits data DATA, which is inputted from the outside, to the column select circuit 150 during the program operation, or outputs data, read from the memory cells during the read operation, to the outside.

The pass/fail check circuit 170 may be configured to detect an amount of current, which changes based on check signals FF[0:k] outputted from the read/write circuits PB after the verification operation which determines the program pass/fail. The pass/fail check circuit 170 outputs check result signals CHECKs to the control circuit 120 based on the check signals FF[0:k].

The control circuit 120 may determine whether the program operation is resumed or not in response to the check result signals CHECKs.

The above-described operation circuits 120 to 170 may perform the program verification operation after consecutively applying a main program pulse and an under program pulse for the program operation of the memory cells connected to the selected word line. The operation circuits 120 to 170 may be configured to apply a ground voltage to the selected word line during a period between the applications of the main program pulse and the under program pulse. That is, the operation circuits 120 to 170 may sequentially apply the main program pulse (or the main program voltage), the ground voltage, and the under program pulse (or the under program voltage) to the selected word line in order to perform the program operation. The ground voltage may be applied for 1 μsec to 5 μsec.

The width of the main program pulse may be different from that of the under program pulse. That is, the width of the main program pulse may be greater or less than that of the under program pulse. In addition, after applying the main program pulse, a plurality of under program pulses may be applied. The operation circuits 120 to 170 may apply the under program pulses at the same voltage level, or gradually decrease or increase the voltage levels of the under program pulses applied to the selected word line. Generally, it is preferable that the voltage of the main program pulse is greater than that of the under program pulses, for example, by 0.1 V to 0.5 V.

After a predetermined number of the program loops are performed, the operation circuits 120 to 170 may apply only the main program pulse while performing the next program loop.

Figure 3A:
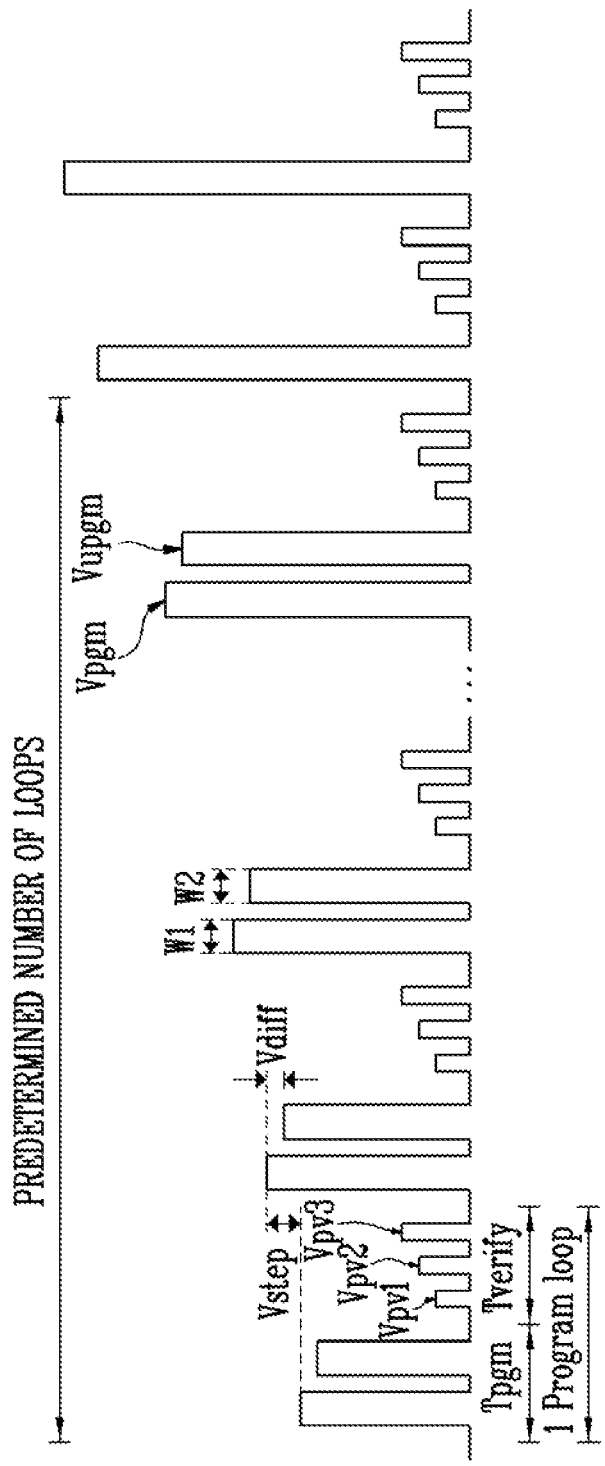
Figure 3C:
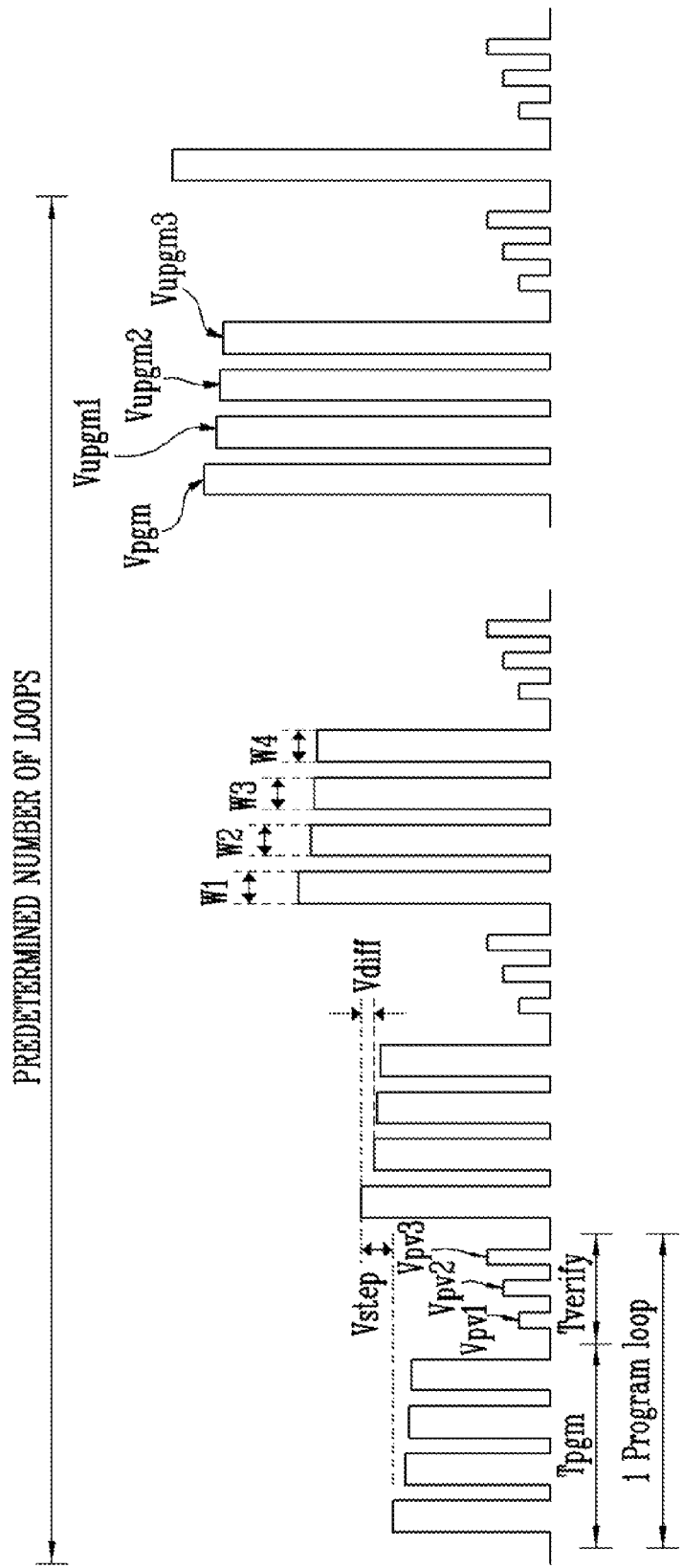

Hereinafter, operational methods of the operation circuits 120 to 170, which perform the program operation using the main program pulse and the under program pulse, are described in detail. FIGS. 3A to 3C are waveform diagrams illustrating an operational method of the semiconductor device according to the exemplary embodiment of the present invention.

Referring to FIGS. 1, 2 and 3A, the operation circuits 120 to 170 perform the program loop including the program operation and the program verification operation to store data in the memory cells (e.g., C00 to C0*k*) connected to the selected word line (e.g., WL0). First, the operation circuits 120 to 170 apply a program permit voltage (e.g., a ground voltage) to a bit line of a program target cell and apply a program inhibit voltage (e.g., a power supply voltage) to a bit line of a program inhibit cell, based on data that may be stored in a memory cell and a threshold voltage of the memory cell.

Subsequently, the operation circuits 120 to 170 consecutively apply a main program pulse Vpgm and an under program pulse Vupgm to the selected word line (e.g., WL0) within a program operation period Tpgm. More specifically, for example, the operation circuits 120 to 170 may apply the under program pulse Vupgm to the selected word line (e.g., WL0) after applying the main program pulse Vpgm and then applying a ground voltage for 1 μsec to 5 μsec.

The voltage of under program pulse Vupgm may be less than that of the main program pulse Vpgm. For example, a voltage difference Vdiff between the main program pulse Vpgm and the under program pulse Vupgm may be within 0.1 V to 0.5 V. Further, a width W1 of the main program pulse Vpgm may be different from a width W2 of the under program pulse Vupgm. That is, the width W1 of the main program pulse Vpgm may be greater than the width W2 of the under program pulse Vupgm. In addition, the width W1 of the main program pulse Vpgm may be less than the width W2 of the under program pulse Vupgm.

After the program operation is performed, the program verification operation of the memory cells is performed in a verification operation period Tverify. The operation circuits 120 to 170 apply different program verification voltages Vpv1 to Vpv3 to the selected word line WL0 after precharging the bit lines. For example, when data of 2 bits is stored in a unit cell, the verification operation may be performed using three different verification voltages Vpv1 to Vpv3. In addition, when data of 3 bits is stored in the unit cell, the verification operation may be performed using seven different verification voltages. Then, the operation circuits 120 to 170 may detect voltage changes of the bit lines, and thus, program states of the memory cells may be determined.

Based on the verification result, memory cells, in which erase data is stored, and memory cells, in which threshold voltages are increased up to a target level, may be processed as program inhibit cells in the next program loop. Further, memory cells having lower threshold voltages than the target level, in which the program data is stored, may be processed as program permit cells in the next program loop. When all the threshold voltages of the memory cells, in which the program data is stored, is greater than the target level thereof, the program loop is completed.

Accordingly, one program loop is completed. When the memory cell having a lower threshold voltage than the target level among the memory cells, in which the program data is stored, is detected, the next program loop is performed.

The operation circuits 120 to 170 increase the main program pulse Vpgm by a step voltage Vstep for the next program loop. Similar to above, the operation circuits 120 to 170 may also increase the under program pulse Vupgm by the step voltage Vstep. Accordingly, a voltage difference Vdiff between the main program pulse Vpgm and the under program pulse Vupgm may remain within 0.1 V to 0.5 V.

The operation circuits 120 to 170 perform the program operation using the increased main program pulse Vpgm and the increased under program pulse Vupgm. The program operation may be performed using an above-described method. After the program operation is completed, the program verification operation may be performed using an above-described method. Thus, the program loop may be repeatedly performed until each of all the threshold voltages of the memory cells, in which the program data is stored, is greater than the target level thereof.

Meanwhile, after a predetermined number of the program loops are performed, the operation circuits 120 to 170 may apply only the main program pulse to the selected word line during the program operation while performing the next program loop.

Since the under program pulse Vupgm is applied after the main program pulse Vpgm is applied as described above, a source bouncing phenomenon or generation of an under program cell caused by a loss of charge may be suppressed.

Hereinafter, operation methods of the operation circuits 120 to 170, which perform the program operation using the main program pulse and the plurality of under program pulses, are described.

Referring to FIG. 3B, a program operation and a program verification operation may be performed using the same method described in FIG. 3A. However, only a plurality of under program pulses Vupgm1 to Vupgm3 may be consecutively applied after a main program pulse Vpgm is applied in the program operation.

The voltage levels of under program pulses Vupgm1 to Vupgm3 are less than that of the main program pulse Vpgm. For example, the under program pulses Vupgm1 to Vupgm3 may be lower, by 0.1 V to 0.5 V, than the main program pulse Vpgm. Specifically, the maximum voltage level of the under program pulse Vupgm3 among the under program pulses Vupgm1 to Vupgm3 may be less, by 0.1 V, than the main program pulse Vpgm. In addition, the minimum level of the under program pulse Vupgm1 among the under program pulses Vupgm1 to Vupgm3 may be less, by 0.5 V, than the main program pulse Vpgm.

The operation circuits 120 to 170 may apply the first under program pulse Vupgm1 after applying the main program pulse Vpgm and pausing for 1 μsec to 5 μsec, and apply the next under program pulse Vupgm2 after applying the first under program pulse Vupgm1 and pausing for 1 μsec to 5 μsec. That is, the operation circuits 120 to 170 may apply the first under program pulse Vupgm1 after the main program pulse Vpgm is applied and a ground voltage is applied for 1 μsec to 5 μsec, and apply the next under program pulse Vupgm2 after the first under program pulse Vupgm1 is applied and the ground voltage is applied for 1 μsec to 5 μsec.

A width W1 of the main program pulse Vpgm may be different from widths W2 to W4 of the under program pulses Vupgm1 to Vupgm3. That is, the width W1 of the main program pulse Vpgm may be greater than the widths W2 to W4 of the under program pulses Vupgm1 to Vupgm3. In addition, the width W1 of the main program pulse Vpgm may be less than the widths W2 to W4 of the under program pulses Vupgm1 to Vupgm3. Meanwhile, the widths W2 to W4 of the under program pulses Vupgm1 to Vupgm3 may be the same. In addition, the width W2 of the under program pulse Vupgm1 may be the smallest width, and the width W4 of the under program pulse Vupgm3 may be the greatest width. In contrast, the width W2 of the under program pulse Vupgm1 may be the greatest width, and the width W4 of the under program pulse Vupgm3 may be the smallest width.

The operation circuits 120 to 170 may apply different levels of the under program pulses Vupgm1 to Vupgm3 in the program operation. For example, the levels of the under program pulses Vupgm1 to Vupgm3 applied to the selected word line may be gradually increased.

After a predetermined number of program loops are performed, the operation circuits 120 to 170 may apply only the main program pulse to the selected word line during the program operation while performing the next program loop.

Referring to FIG. 3C, the levels of the under program pulses Vupgm1 to Vupgm3 applied to a selected word line may be gradually decreased.

Figure 4:
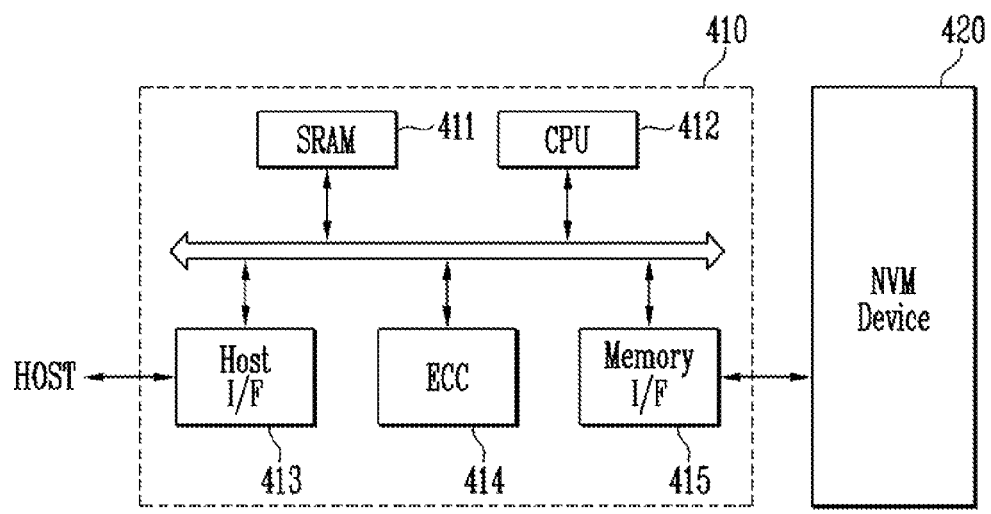
FIG. 4 is a block diagram briefly illustrating a memory system according to an exemplary embodiment of the present invention.

FIG. 4 is a block diagram briefly Illustrating a memory system according to an exemplary embodiment of the present invention.

Referring to FIG. 4, a memory system 400 according to the exemplary embodiment of the present invention may include a nonvolatile memory (NVM) device 420 and a memory controller 410.

The NVM device 420 may correspond to the semiconductor device described in FIG. 1, and perform a program loop using the program voltages and the verification voltages described in FIG. 3. The memory controller 410 may include a static random access memory device (SRAM) 411, a central processing unit (CPU) 412, a host interface (I/F) 413, an error correction code block (ECC) 414, and a memory interface (I/F) 415. The memory controller 410 may be configured to control the NVM device 420. A memory card or semiconductor disk device (solid state drive/disk: SSD) may be provided by combining the NVM device 420 and the memory controller 410. The SRAM 411 is used as an operational memory of the central processing unit (CPU) 412. The host interface (I/F) 413 may include a data exchange protocol for a host HOST connected to the memory system 400. The error correction code block (ECC) 414 detects and corrects an error included in data read from a cell region of the NVM device 420. The memory I/F 415 interfaces with the NVM device 420 of the exemplary embodiment of the present invention. The CPU 412 performs overall control operations for data exchange of the memory controller 410.

Even though it is not described in the accompanying drawings, it is well-known to those of ordinary skill in the art that the memory system 400 according to the exemplary embodiment of the present invention may further include a ROM (not shown) or the like which stores code data for interfacing with a host HOST. The NVM device 420 may be provided as a multi-chip package including a plurality of flash memory chips. The memory system 400 of the exemplary embodiment of the present invention may be a storage medium that has improved operation characteristics and high reliability. Specifically, a flash memory device of the exemplary embodiment of the present invention may be included in a memory system such as a semiconductor disk device (e.g., an SSD) which has been actively studied. In this case, the memory controller 410 may be configured to communicate with an external apparatus, for example, a host HOST, through one of various interface protocols such as a universal serial bus (USB), a multi-media card (MMC), a peripheral component interconnect express (PCI-E), a serial advanced technology attachment (SATA), a parallel ATA (PATA), a small computer system interface (SCSI), an earth science data interface (ESDI), an integrated development environment (IDE), etc.

Figure 5:
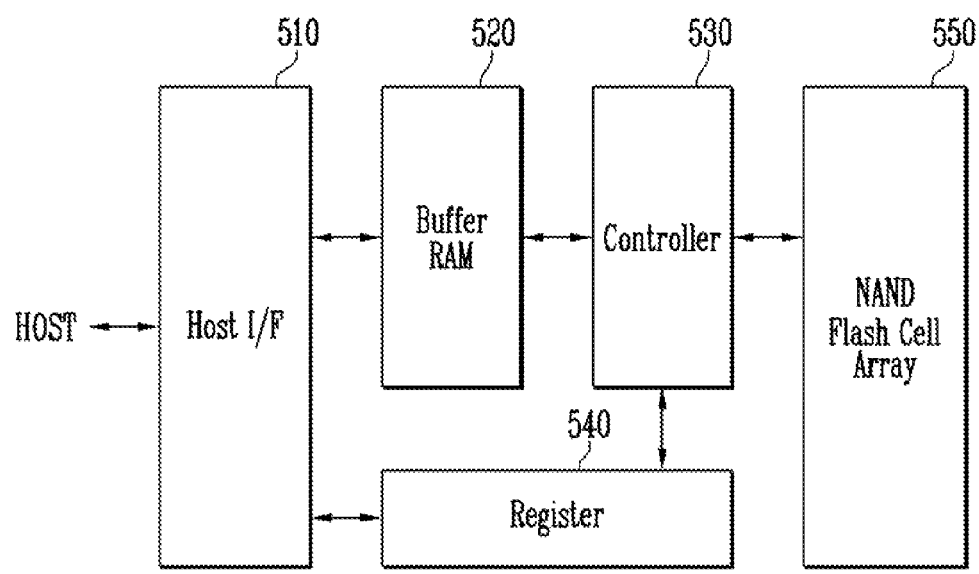
FIG. 5 is a block diagram briefly showing a fusion memory device or memory system which performs a program operation according to an exemplary embodiment of the present invention.

FIG. 5 is a block diagram briefly showing a fusion memory device or memory system which performs a program operation according to an exemplary embodiment of the present invention. For example, the exemplary embodiment of the present invention may be applied to a OneNAND™ flash memory device 500 as a fusion memory device.

The OneNAND™ flash memory device 500 includes a host I/F 510 to exchange various information with a device using a different protocol, a buffer RAM 520 in which driving codes of a memory device are embedded or data is temporarily stored, a controller 530 which controls a read and program operation and all states in response to external control signals and commands, a register 540 which stores data such as commands, addresses and configuration information which defines the system operational environment inside of the memory device, and a NAND flash cell array 550 including operation circuits which have NVM cells and page buffers. In response to a write request from a host HOST, the OneNAND™ flash memory device 500 may program data in a general method.

Figure 6:
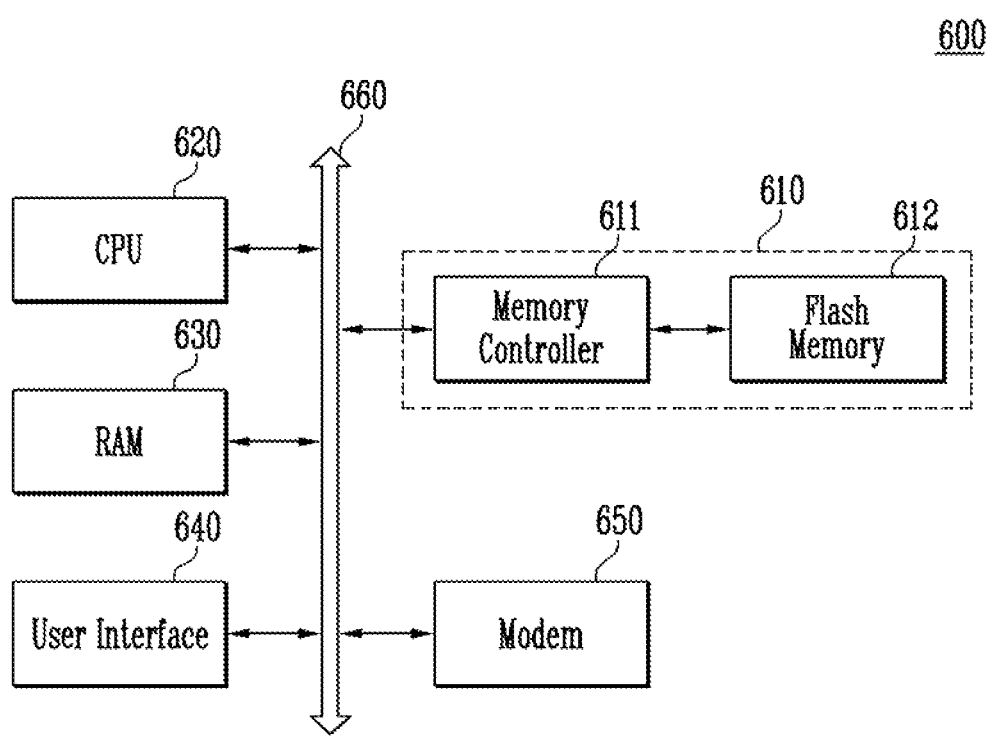
FIG. 6 is a block diagram briefly showing a computing system including a flash memory device according to an exemplary embodiment of the present invention.

FIG. 6 is a block diagram briefly showing a computing system including a flash memory device according to an exemplary embodiment of the present invention.

A computing system 600 according to the exemplary embodiment of the present invention includes a microprocessor (CPU) 620, a RAM 630, a user interface 640, a modem 650 such as a baseband chipset, and a memory system 610, which are electrically connected to a system bus 660. When the computing system 600 according to the exemplary embodiment of the present invention is a mobile device, a battery (not shown) which supplies an operational voltage of the computing system 600 may be additionally provided. Even though it is not described in the accompanying drawings, it is well-known to those of ordinary skill in the art that the computing system 600 according to the exemplary embodiment of the present invention may further include an application chipset, a camera image processor (CIS), a mobile DRAM, etc. The memory system 610, for example, may form an SSD which uses the NVM device described in FIG. 1 to store data. Further, the memory system 610 may be provided as a flash memory (e.g., an OneNAND™ flash memory device described in FIG. 5).

According to the present invention, the electrical characteristics and reliability of the semiconductor device may be improved.

In the drawings and specification, there have been disclosed typical exemplary embodiments of the invention, and although specific terms are employed, they are used in a generic and descriptive sense only and not for purposes of limitation. As for the scope of the invention, it is to be set forth in the following claims. Therefore, it will be understood by those of ordinary skill in the art that various changes in form and detail may be made therein without departing from the spirit and scope of the present invention as defined by the following claims.

What is claimed is:

1. A semiconductor device, comprising:
a memory block including memory cells connected to a word line; and
an operation circuit suitable for consecutively applying a main program pulse and a plurality of sub program pulses to the word line to perform a program operation of the memory cells, and suitable for performing a program verification operation of the memory cells,
wherein the plurality of sub program pulses has a lower voltage than the main program pulse, and
the main program pulse and the plurality of sub program pulses are consecutively applied to the word line. the plurality of sub program pulses gradually increasing.

2. The semiconductor device of claim 1, wherein the operation circuit performs the program verification operation using a plurality of different program verification voltages.

3. The semiconductor device of claim 1, wherein the operation circuit applies a ground voltage to the word line in a period between the main program pulse and a first sub program pulse, among the plurality of sub program pulses, and between the plurality of sub program pulses.

4. The semiconductor device of claim 3, wherein the operation circuit applies the ground voltage for 1 μsec to 5 μsec.

5. The semiconductor device of claim 1, wherein a width of the main program pulse is different from widths of the plurality of sub program pulses.

6. The semiconductor device of claim 5, wherein the width of the main program pulse is greater than the widths of the plurality of sub program pulses.

7. The semiconductor device of claim 5, wherein the width of the main program pulse is smaller than the widths of the plurality of sub program pulses.

8. The semiconductor device of claim 1, wherein a level of the main program pulse is greater, by 0.1 V to 0.5 V, than levels of the plurality of sub program pulses.

9. The semiconductor device of claim 1, wherein the operation circuit performs a first program loop and a second program loop.

10. The semiconductor device of claim 9, wherein the operation circuit performs the second program loop by applying only the main program pulse and performing the program verification operation after performing the first program loop a predetermined number of times.

11. The semiconductor device of claim 1, wherein the operation circuit applies a plurality of program pulses as the plurality of sub program pulses.

12. The semiconductor device of claim 11, wherein the operation circuit applies a ground voltage to the word line in a period between applications of the program pulses.

13. The semiconductor device of claim 12, wherein the operation circuit applies the ground voltage for 1 μsec to 5 μsec.

14. The semiconductor device of claim 11, wherein the operation circuit applies the plurality of sub program pulses at different voltages.

15. A semiconductor device, comprising:
a memory block including a plurality of word lines each connected to a plurality of memory cells; and
an operation circuit suitable for performing a program loop including a program operation for programming memory cells of a selected word line, among the plurality of word lines, and a program verification operation for verifying the program operation of the memory cells,
wherein the operation circuit performs the program operation by consecutively applying a first program pulse and a plurality of second program pulses, having a lower voltage than the first program pulse, to the selected word line, and
the first program pulse and the plurality of second program pulses are consecutively applied to the word line, the plurality of second program pulses gradually increasing.

16. The semiconductor device of claim 15, wherein the operation circuit performs the program operation by applying only the first program pulse to the selected word line after performing the program loop a predetermined number of times.

* * * * *